(12) United States Patent
Inoda et al.

(10) Patent No.: US 8,520,878 B2
(45) Date of Patent: Aug. 27, 2013

(54) MICROPHONE UNIT

(75) Inventors: Takeshi Inoda, Osaka (JP); Ryusuke Horibe, Osaka (JP); Fuminori Tanaka, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 402 days.

(21) Appl. No.: 12/703,989

(22) Filed: Feb. 11, 2010

(65) Prior Publication Data

US 2010/0202649 A1  Aug. 12, 2010

(30) Foreign Application Priority Data

Feb. 10, 2009 (JP) ................................. 2009-028387

(51) Int. Cl.
*H04R 9/08* (2006.01)
(52) U.S. Cl.
USPC ............................. 381/361; 381/175; 381/355
(58) Field of Classification Search
USPC .................................. 381/360, 361, 175, 355
See application file for complete search history.

(56) References Cited

U.S. PATENT DOCUMENTS

2008/0159558 A1* 7/2008 Lan et al. ......................... 381/91
2009/0180655 A1* 7/2009 Tien et al. ....................... 381/361

FOREIGN PATENT DOCUMENTS

JP    2008-092183 A    4/2008
JP    2009-253891    *    4/2008

* cited by examiner

*Primary Examiner* — Davetta W. Goins
*Assistant Examiner* — Amir Etesam
(74) *Attorney, Agent, or Firm* — Morgan, Lewis & Bockius LLP

(57) ABSTRACT

A microphone unit is provided with an electroacoustic conversion portion that includes a diaphragm vibrated by sound pressure and that converts the sound pressure into electrical signals and a board on which the electroacoustic conversion portion is mounted. In the board, there are provided a board opening portion that is formed to face the diaphragm and locating walls that come in contact with the electroacoustic conversion portion to locate the electroacoustic conversion portion.

15 Claims, 3 Drawing Sheets

MICROPHONE UNIT

This application is based on Japanese Patent Application No. 2009-28387 filed on Feb. 10, 2009, the contents of which are hereby incorporated by reference.

BACKGROUND OF THE INVENTION

1. Field of the Invention

The present invention relates to a microphone unit that converts a sound pressure (generated such as by voice) into electrical signals and outputs the resulting signals.

2. Description of Related Art

Conventionally, microphone units are applied to voice input devices, examples of which are sound communication devices such as mobile telephones and transceivers, information processing systems, such as voice authentication systems, that utilize a technology for analyzing input voice and recording devices. Conventionally, as these microphone units, microphone units having various configurations are developed (for example, see patent document 1).

FIG. 6 is a schematic cross-sectional view showing an example of the configuration of a conventional microphone unit. Among conventional microphone units, there is a microphone unit that includes, as with the microphone unit 100 shown in FIG. 6, a board 101 that has an opening portion 101a which is used as a sound passage, a MEMS (micro electro mechanical system) chip 102 that is mounted on the board 101 so as to cover the opening portion 101a, an IC (integrated circuit) 103 that is mounted on the board 101 and is connected electrically through a wire 105 to the MEMS chip 102, and a shield cover 104 that covers the MEMS chip 102 and the IC 103 mounted on the board 101.

The microphone unit 100 configured as described above converts, with the MEMS chip 102, sound signals transmitted through the opening portion 101a into electrical signals, amplifies the resulting electrical signals with the IC 103 and outputs the amplified signals through an unillustrated electrical pad to the outside.

Patent document 1: JP-A-2008-92183

SUMMARY OF THE INVENTION

However, the inventors of the present invention have found the following problem with the conventional microphone unit 100 in which the MEMS chip 102 is arranged to cover the opening portion 101a formed in the board 101.

In the conventional microphone unit 100, for example, adhesive is applied to the outer circumferential portion of the MEMS chip 102, and then the MEMS chip 102 is mounted while its location is being adjusted such that the MEMS chip 102 is arranged in a predetermined position. At the time of the mounting, the position of the MEMS chip 102 is generally adjusted with the MEMS chip 102 observed with, for example a CCD (charge coupled device) camera.

However, since the size of microphone units tends to be reduced partly because electronic devices tend to be decreased in size, even when the position of the MEMS chip 102 is adjusted with the MEMS chip 102 observed with a CCD camera or the like, it is becoming difficult to accurately adjust the position of the MEMS chip 102. Thus, when the microphone unit 100 is assembled, it is more likely that the position of the MEMS chip 102 is displaced from the target position.

In the configuration of the conventional microphone unit 100, if the position of the MEMS chip 102 is displaced from the target position, the portion of the MEMS chip 102 that does not usually overlap other parts may overlap the opening portion 101a, and adhesive may enter the opening portion 101a. In these cases, since the opening portion 101a is blocked partially or wholly, it is impossible to obtain the desired characteristics of the microphone.

To overcome this problem, the present invention has an object to provide a microphone unit in which an electroacoustic conversion portion for converting a sound pressure into electrical signals is arranged to cover an opening portion formed in a board and in which the electroacoustic conversion portion is highly accurately mounted.

To achieve the above object, according to one aspect of the present invention, there is provided a microphone unit including: an electroacoustic conversion portion that includes a diaphragm vibrated by sound pressure and that converts the sound pressure into an electrical signal; and a board on which the electroacoustic conversion portion is mounted. Here, the board includes a board opening portion that is formed to face the diaphragm and a locating wall that is provided around the board opening portion and that comes in contact with the electroacoustic conversion portion to locate the electroacoustic conversion portion.

With this configuration, since the locating walls are provided around the board opening portion, it is possible to accurately mount the electroacoustic conversion portion in the target position of the board. Thus, the board opening portion arranged to face the diaphragm is prevented from being blocked such as by joining material or the like used when the electroacoustic conversion portion is mounted, with the result that a microphone unit having the desired characteristics can be stably manufactured.

The microphone unit configured as described above may include a first sound passage that leads from an outside through the board opening portion to a first surface of the diaphragm; and a second sound passage that leads from the outside to a second surface which is a back side of the diaphragm and opposite the first surface. Here, the diaphragm may be vibrated by a difference between sound pressures applied on the first surface and the second surface.

With this configuration, it is possible to obtain a so-called differential microphone unit, and this makes it possible to obtain a high-performance microphone unit. In other words, with this configuration, it is possible to manufacture a high-performance microphone unit having stable characteristics.

In the further specific configuration of the microphone unit configured as described above, the microphone unit may include a cover portion that is arranged on the board to cover the electroacoustic conversion portion. Here, a first opening portion and a second opening portion may be formed in one surface of the cover portion, the first sound passage may be a sound passage that leads from the outside to the first opening portion to another board opening portion, other than the board opening portion, formed in the board to the board opening portion and to the first surface in this order, and the second sound passage may be a sound passage that leads from the outside to the second opening portion to an inner space formed between the cover portion and the board and to the second surface in this order.

Since, in the differential microphone unit of this configuration, sound waves are transmitted to both the sides of the diaphragm through the two opening portions in the same surface, it is possible to simply the sound passage of the voice input device incorporating it. Hence, this configuration is desirable.

In the microphone unit configured as described above, the locating wall may be included in a projection portion provided on the board, or may be included in a recess portion provided in the board.

In the microphone unit configured as described above, the electroacoustic conversion portion may be a MEMS (micro electro mechanical system) chip. Thus, it is possible to manufacture a high-performance and small microphone unit having stable characteristics.

According to the present invention, it is possible to provide the microphone unit in which the electroacoustic conversion portion for converting a sound pressure into electrical signals is arranged to cover the opening portion provided in the board and with which the electroacoustic conversion portion can be accurately mounted. Thus, it is possible to stably manufacture the microphone unit having the desired characteristics.

DETAILED DESCRIPTION OF PREFERRED EMBODIMENTS

An embodiment of a microphone unit according to the present invention will be described in detail below with reference to the accompanying drawings.

Figure 1A:
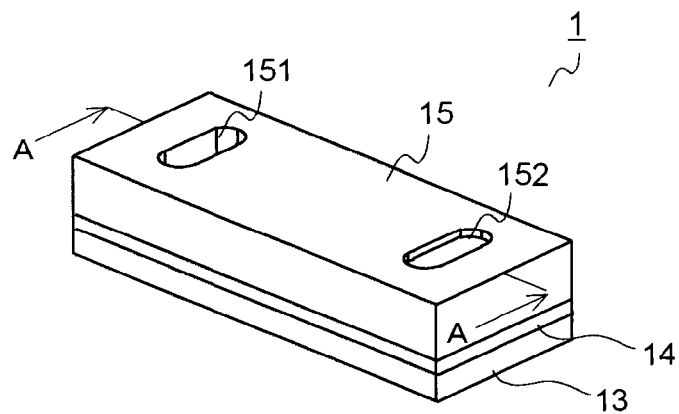
FIG. 1A is a schematic perspective view showing the configuration of a microphone unit of this embodiment.
Figure 1B:
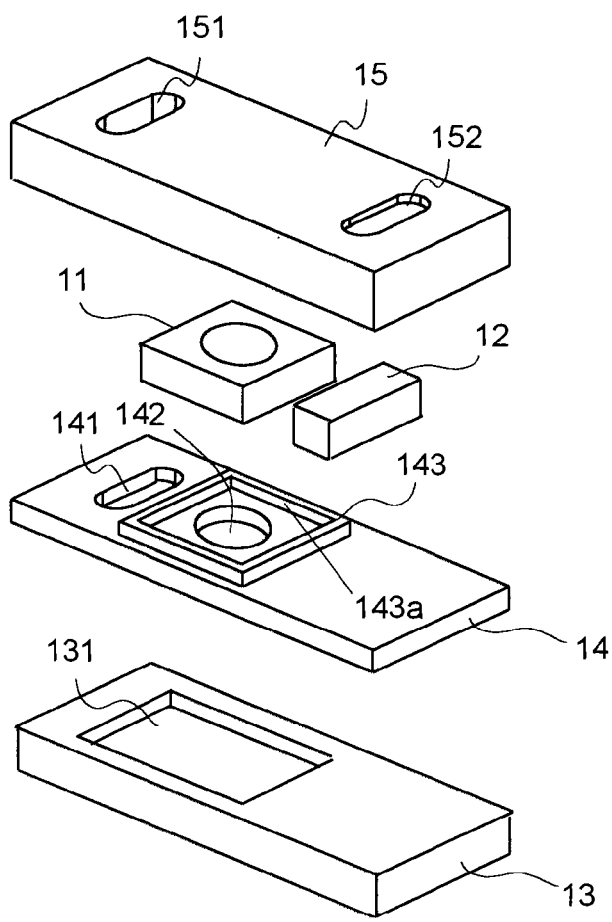
FIG. 1B is an exploded perspective view showing the configuration of the microphone unit of this embodiment.
Figure 2:
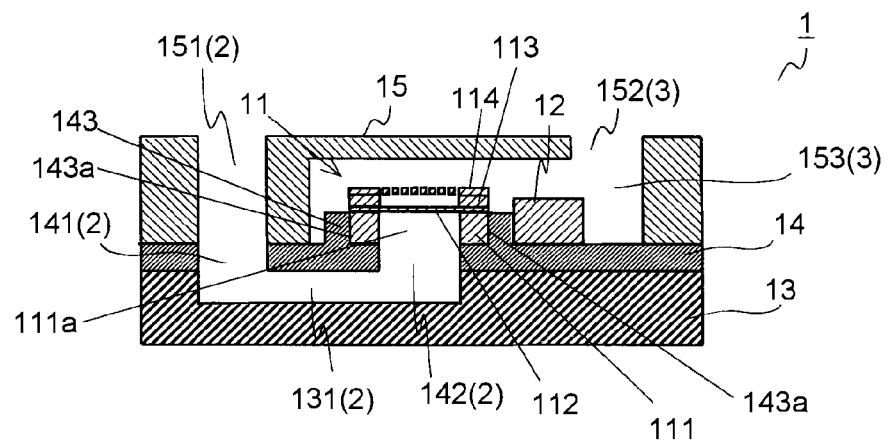
FIG. 2 is a schematic cross-sectional view taken along position A-A of FIG. 1A.

FIG. 1A is a schematic perspective view showing the configuration of the microphone unit of this embodiment. FIG. 1B is an exploded perspective view showing the configuration of the microphone unit of this embodiment. FIG. 2 is a schematic cross-sectional view taken along position A-A of FIG. 1A.

As shown in FIGS. 1A, 1B and 2, the microphone unit 1 of this embodiment is provided with a MEMS (micro electro mechanical system) chip 11, an ASIC (application specific integrated circuit) 12, a first board 13, a second board 14 and a cover portion 15.

The MEMS chip 11 is an embodiment of an electroacoustic conversion portion that converts a sound pressure into electrical signals, and is formed with a condenser microphone. The MEMS chip 11 is formed with a silicon chip, and includes, as shown in FIG. 2, an insulation base substrate 111, a diaphragm 112, an insulation layer 113 and a fixed electrode 114. As shown in FIG. 1B, the outside shape of the MEMS chip 11 is substantially in the form of a rectangular parallelepiped, and the vibration portion of the diaphragm 112 is substantially circular.

In the base substrate 111 of the MEMS chip 11, an opening 111a is formed that is substantially circular in a plan view. The diaphragm 112 formed on the base substrate 111 is a thin film that is vibrated (vibrated vertically) by receiving sound waves, is conductive and forms an end of the electrode. The fixed electrode 114 is arranged to face the diaphragm 112 with the insulation layer 113 sandwiched therebetween. In this way, the diaphragm 112 and the fixed electrode 114 form capacitance. In the fixed electrode 114, a plurality of sound holes are formed such that the sound waves can pass through them, and the sound waves coming from the upper side of the diaphragm 112 reach the upper surface of the diaphragm 112.

The MEMS chip 11 is configured such that sound pressures are applied to both the upper surface (corresponding to "a second surface" of the present invention) of the diaphragm 112 and the lower surface (corresponding to "a first surface" of the invention) thereof. Hence, the diaphragm 112 vibrates according to the difference between the sound pressure applied to the upper surface and the sound pressure applied to the lower surface. This vibration causes variations in the distance between the diaphragm 112 and the fixed electrode 114, and this causes variations in the capacitance between the diaphragm 112 and the fixed electrode 114. The variations in the capacitance are extracted as electrical signals, and hence the sound presses are converted into electrical signals.

The configuration of the MEMS chip serving as the electroacoustic conversion portion is not limited to the configuration of this embodiment. For example, although, in this embodiment, the diaphragm 112 is located below the fixed electrode 114, a configuration or the like that achieves the opposite relationship (in which the diaphragm is located above the fixed electrode) may be employed.

The ASIC 12 is an integrated circuit that amplifies the electrical signals extracted based on the variations in the capacitance of the MEMS chip 11. The ASIC 12 may include a charge pump circuit and an operational amplifier such that the variations in the capacitance of the MEMS chip 11 can be accurately detected. The electrical signals amplified by the ASIC 12 are output to the outside of the microphone unit 1 through wiring provided on the board, on which the microphone unit 1 is mounted.

The MEMS chip 11 and the ASIC 12 are flip-chip mounted on the second board 14, which will be described in detail later.

In the first board 13, there is provided a groove portion 131 that is substantially rectangular in a plan view. The method of forming the groove portion 131 is not particularly limited; for example, the groove portion 131 is formed mechanically or otherwise. Although not shown in the figure, on the first board 13, there are formed: an electrode pad for feeding electrical power from the outside to the ASIC 12 included in the microphone unit 1; an electrode pad for outputting the electrical signals amplified by the ASIC 12 to the outside; and an electrode pad and the like for GND (ground) connection, and various types of wirings connected to these electrode pads are also formed.

The second board 14 is placed and joined on the first board 13. In the second board 14, a first substrate opening portion 141 is formed that communicates with the groove portion 131 and that is substantially oval in a plan view. In the second board 14, a second substrate opening portion 142 is formed that communicates with the groove portion 131, that is formed to face the diaphragm 112 and that is substantially circular in a plan view. The method of forming these substrate opening portions 141 and 142 is not particularly limited; for example, the substrate opening portions 141 and 142 are formed mechanically or otherwise. The first substrate opening portion 141 is an embodiment of "another substrate opening portion" of the present invention; the second substrate opening portion 142 is an embodiment of "a substrate opening portion" of the invention.

On the second board 14, a frame-shaped projection portion 143 is formed so as to surround the second substrate opening portion 142. The method of forming the frame-shaped projection portion 143 is not particularly limited; for example, the frame-shaped projection portion 143 is formed by producing a frame member that is separate from the second board 14 and adhering it to the second board 14.

The frame-shaped projection portion 143 is provided to locate and fix the position of the MEMS chip 11, which is mounted on the second board 14. Specifically, in the frame-shaped projection portion 143, the interior shape of the frame is substantially equal to the shape of the MEMS chip 11 (substantially rectangular in a plan view). The size of the interior of the frame in a plan view is slightly larger than that of the MEMS chip 11, and is substantially equal to that of the MEMS chip 11.

Hence, the MEMS chip 11 is fitted into the interior of the frame of the frame-shaped projection portion 143, and thus the four side surfaces of the MEMS chip 11 come in contact with the inner surfaces 143a of the frame-shaped projection portion 143, with the result that the MEMS chip 11 is located and fixed. In other words, the inner surfaces 143a of the frame-shaped projection portion 143 function as walls for locating the position of the MEMS chip 11.

The height of the frame-shaped projection portion 143 (its length in a direction perpendicular to the board surface of the second board 14) is preferably set such that the side surfaces of the flip-chip mounted MEMS chip 11 come in contact with the inner surfaces 143a (locating walls) of the frame-shaped projection portion 143; however, the height is not particularly limited. The height of the frame-shaped projection portion 143 is set equal to, for example, about the half of the thickness of the MEMS chip 11.

Although not shown in the figure, on the second board 14, a joint pad is formed that is joined to bump electrodes formed on the MEMS chip 11 and the ASIC 12 when the MEMS chip 11 and the ASIC 12 are flip-chip mounted. The wiring for electrically connecting the MEMS chip 11 to the ASIC 12, the wiring necessary for feeding electric power from the outside, the wiring for outputting, to the outside, the electrical signals amplified by the ASIC 12, the GND wiring and the like are also formed on and in the second board 14. The wiring for electrically connecting the MEMS chip 11 to the ASIC 12 is formed in the second board 14, and, in other words, the second board 14 is a multilayer wiring board.

On the second board 14, there may be provided locating walls for the ASIC 12, but, in this embodiment, such locating walls are not provided. This is because, unlike the MEMS chip 11, the ASIC 12 is not arranged on the board opening portion, and thus it is permissible for the ASIC 12 to be slightly displaced, and the configuration of the second board 14 is prevented from being complicated.

As shown in FIGS. 1A and 1B, the outside shape of the cover portion 15 is substantially in the form of a rectangular parallelepiped, and is arranged so as to cover the second board 14. In the upper surface of the cover portion 15, a first opening portion 151 and a second opening portion 152 are formed. In this embodiment, the first opening portion 151 and the second opening portion 152 are substantially oval in a plan view, but their shapes are not limited to the configuration of this embodiment, and many modifications are possible.

The first opening portion 151 is formed as a through hole that penetrates from the upper surface of the cover portion 15 to the lower surface thereof. The second opening portion 152 communicates with the space that is formed within the cover portion 15 and that is shaped substantially in the form of a rectangular parallelepiped. This space substantially in the form of a rectangular parallelepiped forms an inner space 153 (see FIG. 2) between the cover portion 15 and the second board 14 with the cover portion 15 covered on the second board 14. The MEMS chip 11 and the ASIC 12 are present within the inner space 153.

The microphone unit 1 formed as described above includes, as shown in FIG. 2, a first sound passage 2 that leads from the outside to the lower surface (first surface) of the diaphragm 112 and a second sound passage 3 that leads from the outside to the upper surface (second surface) of the diaphragm 112. The first sound passage 2 is also said to be a sound passage that leads from the outside to the lower surface of the diaphragm 112 through the second substrate opening portion 142, which is formed to face the diaphragm 112. More specifically, the first sound passage 2 includes the first opening portion 151, the first substrate opening portion 141, the groove portion 131 and the second substrate opening portion 142. The second sound passage 3 includes the second opening portion 152 and the inner space 153.

The effects of the microphone unit configured as described above will now be described. Before the effects are described, the properties of sound waves will be described. The sound pressure of a sound wave (the amplitude of a sound wave) is inversely proportional to the distance from the sound source. The sound pressure is rapidly attenuated at a position near the sound source, and the sound pressure is gradually attenuated as it moves away from the sound source.

For example, when the microphone unit 1 is applied to a close-talking voice input device, a user produces voice near the microphone unit 1. Thus, the user's voice is greatly attenuated between the first opening portion 151 and the second opening portion 152, and a large difference is produced between the sound pressure applied to the lower surface of the diaphragm 112 and the sound pressure applied to the upper surface of the diaphragm 112.

On the other hand, as compared with the user's voice, the sound sources of noise components such as ambient noise are far away from the microphone unit 1. Thus, the sound pressure of the noise is little attenuated between the first opening portion 151 and the second opening portion 152, and almost no difference is produced between the sound pressure applied to the lower surface of the diaphragm 112 and the sound pressure applied to the upper surface of the diaphragm 112.

The diaphragm 112 of the microphone unit 1 is vibrated by the difference between the sound pressures of sound waves applied to the upper and lower surfaces simultaneously. As described above, since the difference between the sound pressures of the noises applied to the lower surface and the upper surface of the diaphragm 112 is small, the noises are cancelled out by the diaphragm 112. By contrast, since the difference between the sound pressures of the user's voices applied to the lower surface and the upper surface of the diaphragm 112 is large, the user' voices are not cancelled out, and thus the diaphragm 112 is vibrated.

Hence, with the microphone unit 1 of this embodiment, the diaphragm 112 can be considered to be vibrated only by the user's voice. Therefore, the electrical signals output from the ASIC 12 of the microphone unit 1 can be considered to be signals that indicate only the user's voice having the noise (such as ambient noise) removed. In other words, with the microphone unit 1 of this embodiment, it is possible to acquire, in a simple configuration, electrical signals that indicate only the user's voice having the noise removed.

Since the microphone unit 1 of this embodiment is provided with the frame-shaped projection portion 143 having the locating walls 143a, it is possible to easily mount, in the target position, the MEMS chip 11 including the diaphragm 112 with high accuracy. Thus, with the configuration of this embodiment, it is possible to manufacture high-performance microphone units having stable characteristics.

The embodiment described above is an example, and the microphone unit of the present invention is not limited to the configuration of the embodiment described above. In other words, many modifications on the configuration of the embodiment described above are possible without departing from the scope of the invention.

Figure 3A:
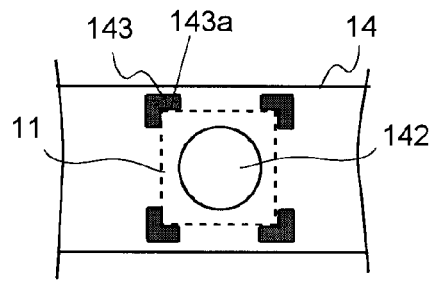
FIG. 3A is a diagram showing a variation of the configuration of a projection portion that has locating walls and that are included in the microphone unit.
Figure 3B:
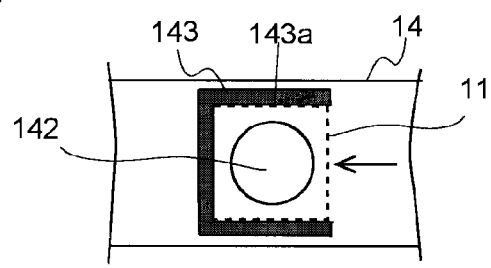
FIG. 3B is a diagram showing a variation of the configuration of a projection portion that has locating walls and that are included in the microphone unit.
Figure 3C:
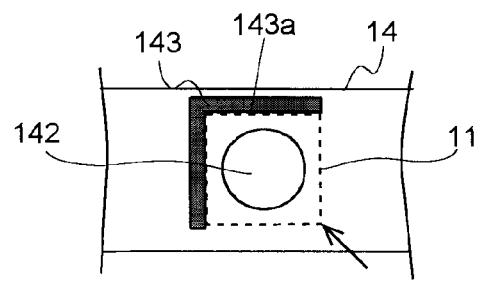
FIG. 3C is a diagram showing a variation of the configuration of a projection portion that has locating walls and that are included in the microphone unit.

For example, in the embodiment described above, the frame-shaped projection portion 143 is formed around the second substrate opening portion 142 in the second board 14 to provide the locating walls 143a for locating the position of the MEMS chip 11; however, the configuration of the projection portion for providing the locating walls is not limited to the configuration of this embodiment. Specifically, for example, variations are possible as shown in FIGS. 3A, 3B and 3C. FIGS. 3A to 3C are plan views as the second board 14 is seen from above.

FIG. 3A shows a configuration in which four projection portions 143 that are substantially L-shaped in a plan view are arranged in the four corners of the MEMS chip 11. With this configuration, it is possible to obtain locating walls 143a that come in contact with the four side surfaces of the MEMS chip 11. With this configuration, as in this embodiment where the frame-shaped projection portions are provided, it is possible to fit and hold the MEMS chip 11, with the result that the microphone unit is easily assembled.

FIG. 3B shows a configuration in which a projection portion 143 substantially C-shaped in a plan view is formed. With this configuration, it is possible to obtain locating walls 143a that come in contact with the three side surfaces of the MEMS chip 11. In this case, when the MEMS chip 11 is fixed (mounted) on the second board 14, it is preferable to fix the MEMS chip 11 with a force applied in a direction indicated by the arrow of FIG. 3B so that the MEMS chip 11 is not moved.

FIG. 3C shows a configuration in which a projection portion 143 substantially L-shaped in a plan view is formed. With this configuration, it is possible to obtain locating walls 143a that come in contact with the two side surfaces of the MEMS chip 11. In this case, when the MEMS chip 11 is fixed (mounted) on the second board 14, it is preferable to fix the MEMS chip 11 with a force applied in a direction indicated by the arrow of FIG. 3C so that the MEMS chip 11 is not moved.

Figure 4:
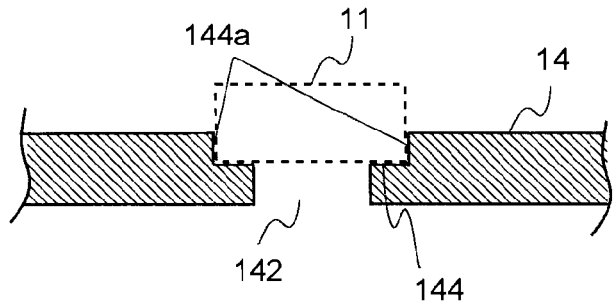
FIG. 4 is a diagram showing another embodiment of locating walls included in the microphone unit.

As shown in FIG. 4, which is a cross-sectional view, the walls for locating the position of the MEMS chip 11 may be obtained from a recess portion 144 instead of the projection portions. That is, a configuration may be employed in which, in the second board 14, the recess portion (groove) 144 (in this configuration, a groove substantially rectangular in a plan view) corresponding in shape to the MEMS chip 11 is formed, in which the MEMS chip 11 is fitted into the recess portion 144 and thus in which the side surfaces (in this configuration, four side surfaces) of the MEMS chip 11 come in contact with the inner surfaces 144a of the recess portion 144. In this case, the inner surfaces 144a of the recess portion 144 also function as walls for locating the position of the MEMS chip 11.

The method of forming the recess portion is not particularly limited; for example, it may be formed integrally with the board or may be formed mechanically or by etching.

Figure 6:
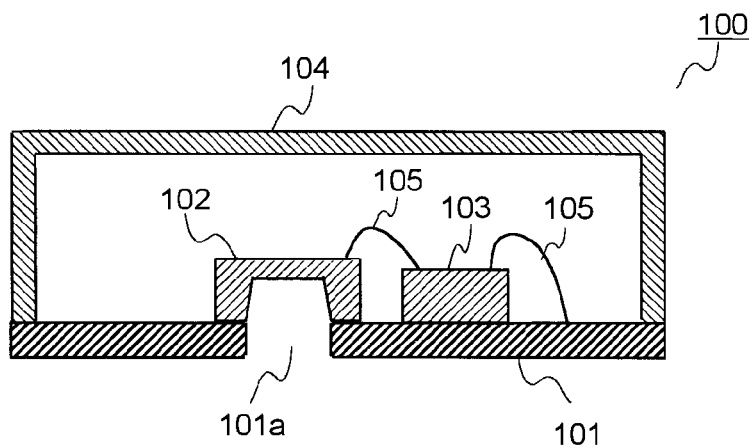
FIG. 6 is a schematic cross-sectional view showing an example of the configuration of a conventional microphone unit.

The embodiment described above deals with a case where the invention is applied to the differential microphone unit in which the two opening portions 151 and 152 are formed in the same surface (upper surface) of the cover portion 15, and in which sound waves received from the same surface are guided to both sides of the diaphragm through the separated sound passages. However, the present invention is widely applied to microphone units in which, in a board on which an electroacoustic conversion portion is mounted, board openings are formed to face a diaphragm included in the electroacoustic conversion portion. In other words, the present invention is not limited to the differential microphone unit, but can also be applied to, for example, the conventional microphone unit 100 shown in FIG. 6.

Although the embodiment described above deals with the configuration in which the MEMS chip 11 and the ASIC 12 are flip-chip mounted, the invention can be naturally applied to microphone units in which the MEMS chip and the ASIC are mounted by wire bonding. When the MEMS chip is mounted by wire bonding, it is possible to advantageously reduce the manufacturing cost and the facility cost.

Figure 5:
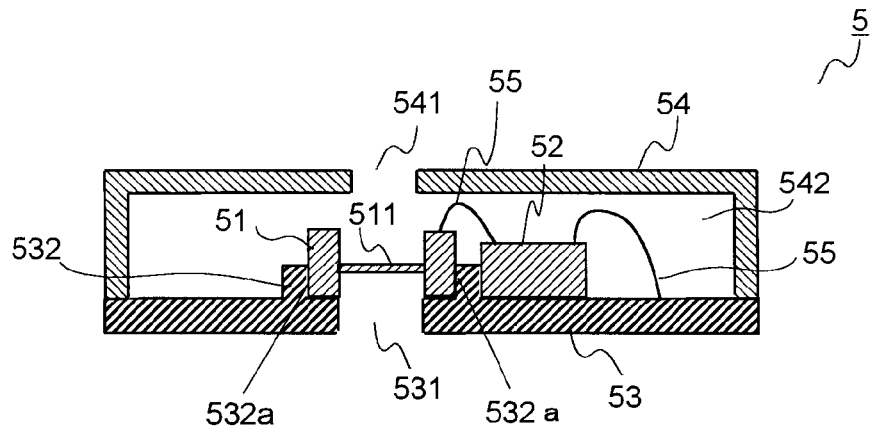
FIG. 5 is a diagram showing an example of another embodiment of the microphone unit according to the present invention.

In FIG. 5 is shown an example of another embodiment of the microphone unit according to the present invention. The microphone unit shown in FIG. 5 is a differential microphone unit; FIG. 5 is a cross-sectional view thereof. The microphone unit 5 is provided with a MEMS chip 51, an ASIC 52, a board 53 on which the MEMS chip 51 and the ASIC 52 are mounted and a cover portion 54.

The MEMS chip 51 and the ASIC 52 are mounted by wire bonding (The reference numeral 55 represents wires.) In the board 53, a board opening portion 531 is formed to face a diaphragm 511 provided in the MEMS chip 51. On the board 53, there is also formed a frame-shaped projection portion 532 including locating walls 532a that come in contact with the MEMS chip 11. The cover portion 54 is arranged to cover the MEMS chip 11 and the ASIC 12; in the upper surface thereof, an opening portion 541 is formed.

In the microphone unit 5, there are formed a sound passage (a first sound passage) that leads from the outside through the board opening portion 531 to the lower surface (a first surface) of the diaphragm 511 and a sound passage (a second sound passage) that leads from the outside through the opening portion 541 in the cover portion 54 and an inner space 542 formed by the board 53 and the cover portion 54 to the upper surface (a second surface) of the diaphragm 511.

In this microphone unit 5, since the frame-shaped projection portion 532 having the locating walls 532a is formed around the board opening portion 531 in the board 53, it is possible to accurately fit the MEMS chip 51 in the target position.

When, as in the microphone unit 5, the MEMS chip 51 is mounted by wire bonding, it is preferable to prevent the entire side surfaces of the MEMS chip 51 from being covered by the locating walls 532a. This is because an operation for the wire bonding is facilitated.

Although, in the embodiment described above, the MEMS chip 11 is separate from the chip of the ASIC 12, the integrated circuit included in the ASIC may be formed on the silicon substrate on which the MEMS chip is formed such that they constitute a monolithic chip.

Although, in the embodiment described above, the electroacoustic conversion portion, which converts the sound pressure into the electrical signals, is the MEMS chip 11, which is formed by utilizing semiconductor manufacturing technology, the present invention is not limited to this configuration. For example, the electroacoustic conversion portion may be a condenser microphone or the like that uses an electret film.

In the embodiment described above, as the electroacoustic conversion portion included in the microphone unit, the so-called condenser microphone is employed. However, the present invention is also applicable to a microphone unit that uses a component other than the condenser microphone. For example, the present invention is applicable to microphone units that use an electrodynamic (dynamic) microphone, an electromagnetic (magnetic) microphone, a piezoelectric microphone and the like.

It is needless to say that the shape of the microphone unit is not limited to the shape of the microphone unit of this embodiment and that it may be modified to be any of various shapes.

The microphone unit of the present invention is suitable for, for example, sound communication devices such as mobile telephones and transceivers, voice processing systems (such as voice authentication systems, voice recognition systems, command generation systems, electronic dictionaries, translation machines and voice input remote controllers) employing a technology for analyzing input voice, recording devices, amplification systems (loudspeakers) and microphone systems.

What is claimed is:

1. A microphone unit comprising:
   an electroacoustic conversion portion that includes a diaphragm vibrated by sound pressure and that converts the sound pressure into an electrical signal; and
   a first board that is placed and joined on a second board;
   the second board on which the electroacoustic conversion portion is mounted;
   a cover portion that includes a first opening portion and a second opening portion formed in one surface of the cover portion and that is arranged on the second board to cover the electroacoustic conversion portion;
   a first sound passage that leads from an outside through the first opening portion of the cover portion to a first surface of the diaphragm; and
   a second sound passage that leads from the outside through the second opening portion of the cover portion to a second surface which is a back surface of the diaphragm,
   wherein the first board includes a groove portion, and the second board includes a first board opening portion communicating with the first opening portion of the cover portion, and the groove portion and a second board opening portion provided opposite to the diaphragm and a locating wall that is provided around the second board opening portion and that comes in contact with the electroacoustic conversion portion to locate the electroacoustic conversion portion.

2. The microphone unit of claim 1,
   wherein the locating wall is included in a projection portion provided on the second board.

3. The microphone unit of claim 1,
   wherein the locating wall is included in a recess portion provided in the second board.

4. The microphone unit of claim 1,
   wherein the electroacoustic conversion portion is a MEMS (micro electro mechanical system) chip.

5. The microphone unit of claim 1
   wherein the first sound passage leads from the outside to the first opening portion of the cover portion to the first board opening portion to the groove portion, and to the second board opening portion, and to the first surface of the diaphragm, and
   the second sound passage leads from the outside to the second opening portion of the cover portion to an inner space formed between the cover portion and the second board and to the second surface of the diaphragm.

6. The microphone unit of claim 5,
   wherein the locating wall is included in a projection portion provided on the second board.

7. The microphone unit of claim 5,
   wherein the locating wall is included in a recess portion provided in the second board.

8. The microphone unit of claim 6,
   wherein the electroacoustic conversion portion is a MEMS (micro electro mechanical system) chip.

9. The microphone unit of claim 7,
   wherein the electroacoustic conversion portion is a MEMS (micro electro mechanical system) chip.

10. The microphone unit of claim 1,
    wherein the groove portion is substantially rectangular in a plan view.

11. The microphone unit of claim 1,
    wherein the first board opening portion, formed on the second board, is substantially oval in a plan view.

12. The microphone unit of claim 4,
    wherein the first board further comprises an electrode pad for feeding electrical power from the outside to the electroacoustic conversion portion; an electrode pad for outputting the electrical signals amplified by the electroacoustic conversion portion to the outside; or an electrode pad for GND (ground) connection of the electroacoustic conversion portion.

13. The microphone unit of claim 5,
    wherein the locating wall is included in a frame-shaped projection portion that is formed around the second board opening portion of the second board.

14. The microphone unit of claim 13,
    wherein the frame-shaped projection portion is substantially C-shaped in a plan view.

15. The microphone unit of claim 13,
    wherein the frame-shaped projection portion is substantially L-shaped in a plan view.

* * * * *